(12) United States Patent
Hsiao et al.

(10) Patent No.: US 7,830,005 B2
(45) Date of Patent: Nov. 9, 2010

(54) BOND PAD ARRAY FOR COMPLEX IC

(75) Inventors: Chuan-Cheng Hsiao, Hsinchu (TW);
Hung-Sung Li, Hsinchu County (TW);
I-Cheng Lin, Hsinchu (TW); Che-Yuan Jao, Hsinchu (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 45 days.

(21) Appl. No.: 12/269,814

(22) Filed: Nov. 12, 2008

(65) Prior Publication Data

US 2010/0117207 A1     May 13, 2010

(51) Int. Cl.
    *H01L 23/48* (2006.01)
(52) U.S. Cl. ............... 257/734; 257/784; 257/E23.152; 257/E21.522; 257/E21.627; 438/612
(58) Field of Classification Search ......... 438/612–617; 257/734, 750, 774, 779, 784
    See application file for complete search history.

(56) References Cited

U.S. PATENT DOCUMENTS

| | | | |
|---|---|---|---|
| 6,856,022 B2* | 2/2005 | Nojiri et al. ............... | 257/773 |
| 7,115,984 B2* | 10/2006 | Poo et al. .................. | 257/698 |
| 7,565,019 B2* | 7/2009 | Dong et al. ................ | 382/236 |
| 2005/0263885 A1* | 12/2005 | Nakamura et al. .......... | 257/737 |

* cited by examiner

*Primary Examiner*—Hsien-ming Lee
(74) *Attorney, Agent, or Firm*—Winston Hsu; Scott Margo; Min-Lee Teng

(57) ABSTRACT

An integrated circuit includes: a substrate; and a bond pad array on the substrate. The bond pad array includes: a row of inner bond pads, each inner bond pad positioned with respect to a plurality of inner pad openings; a plurality of first inner metal layers respectively coupled to the inner bond pads for transmitting signals between the inner pads and an internal circuit, where at least one first inner metal layer has a width less than a width of a corresponding inner bond pad; a row of outer bond pads, staggered with respect to the row of inner bond pads; and a plurality of first outer metal layers respectively coupled to the outer bond pads for transmitting signals between the outer pads and the internal circuit, where at least one inner bond pad overlaps adjacent first outer metal layers.

11 Claims, 4 Drawing Sheets

BOND PAD ARRAY FOR COMPLEX IC

BACKGROUND

The present invention relates to a bond pad array for a complex IC, and more particularly, to a bond pad array that has a small pad pitch and good electro-migration.

Integrated circuit (IC) chips utilize metal pads for receiving and supplying signals to and from other circuitry. The pad is formed by a plurality of metal layers, usually in a rectangular shape, wherein some of the metal layers are utilized for carrying signals between the pads and other circuitry of the IC chip. Conductive lines formed from one or more of the metal layers connect the pads to the circuitry.

Pad sizes are relatively large compared to the chip, so the arrangement of pads limits the remaining space for circuitry. Pads are usually arranged around the edge of the IC chip. In order to utilize the space more effectively, complex IC chips comprise two or more concentric rings of pads, positioned in a stagger pattern. This staggering of the pads enables the conductive lines of the outer row of pads to fit between the pads in the inner row.

Please refer to FIG. 1. FIG. 1 is a diagram showing the structure of part of a conventional complex IC 100. As can be seen, the IC 100 comprises five pads 112, 114, 116, 122, 124, wherein pads 112, 114, 116 form the outer row of the IC 100 and pads 122, 124 form the inner row of the IC 100. Respectively coupled to the outer pads 112, 114, 116 are conductive lines 113, 115, 117, which fit between the inner pads, and respectively coupled to the inner pads 122, 124 are conductive lines 123, 125. As can be seen from the diagram, the width of the outer conductive lines 113, 115, 117 is restricted by the inner pads 122, 124.

In addition please refer to FIG. 2, which is a cross-section diagram of a pad structure 120 of the pad 122 shown in FIG. 2. As can be seen, the complete pad structure 120 comprises a plurality of layers, including a top metal $M_{top}$ 123, the pad 122, a via 20 for connecting the pad 122 and the top metal 123, and a metal layer $M_{top-1}$ 123a that contacts with the top metal 123 through vias 12 and 14. The via connection makes the top metal layer $M_{top}$ 123 have the same potential as $M_{top-1}$ 123a. As can be seen from the diagram, the two metal layers 123, 123a are both wider than the pad 122. Please note that either $M_{top}$ or $M_{top-1}$ can be utilized for transmitting signals to circuitry of the IC chip 100.

The size (or width) of the conductive line (123 or 123a) affects the amount of power that the pad 122 can supply to the IC chip 100, with a wider conductive line supplying more power than a narrower conductive line. As can be seen from FIG. 1, if the pad pitch (distance between neighboring pads) is increased then the width of the conductive lines can be increased. There is therefore a trade-off between power and a number of pads of the IC chip 100. Furthermore, if the pad pitch decreases (pads are placed closer together), the problem of electro-migration is more likely to occur.

SUMMARY

With this in mind, the present invention aims to provide a pad structure for a complex IC that can reduce the pad pitch and therefore increase the number of pads on the surface of an IC chip without reducing the amount of space for circuitry of the IC chip or increasing electro-migration.

A silicon integrated circuit according to an exemplary embodiment of the present invention comprises: a substrate; and a bond pad array on the substrate. The bond pad array comprises: a row of inner bond pads, each inner bond pad positioned with respect to a plurality of inner pad openings; a plurality of first inner metal layers respectively coupled to the inner bond pads for transmitting signals between the inner pads and an internal circuit, where at least one first inner metal layer has a width less than a width of a corresponding inner bond pad; a row of outer bond pads, each outer bond pad positioned with respect to a plurality of outer pad openings, and staggered with respect to the row of inner bond pads; and a plurality of first outer metal layers respectively coupled to the outer bond pads for transmitting signals between the outer pads and the internal circuit, where at least one inner bond pads overlap adjacent first outer metal layers.

These and other objectives of the present invention will no doubt become obvious to those of ordinary skill in the art after reading the following detailed description of the preferred embodiment that is illustrated in the various figures and drawings.

DETAILED DESCRIPTION

The present invention aims to provide a new pad structure for a complex IC chip that offers increased power supply and a small pad pitch without increased electro-migration.

Figure 3:
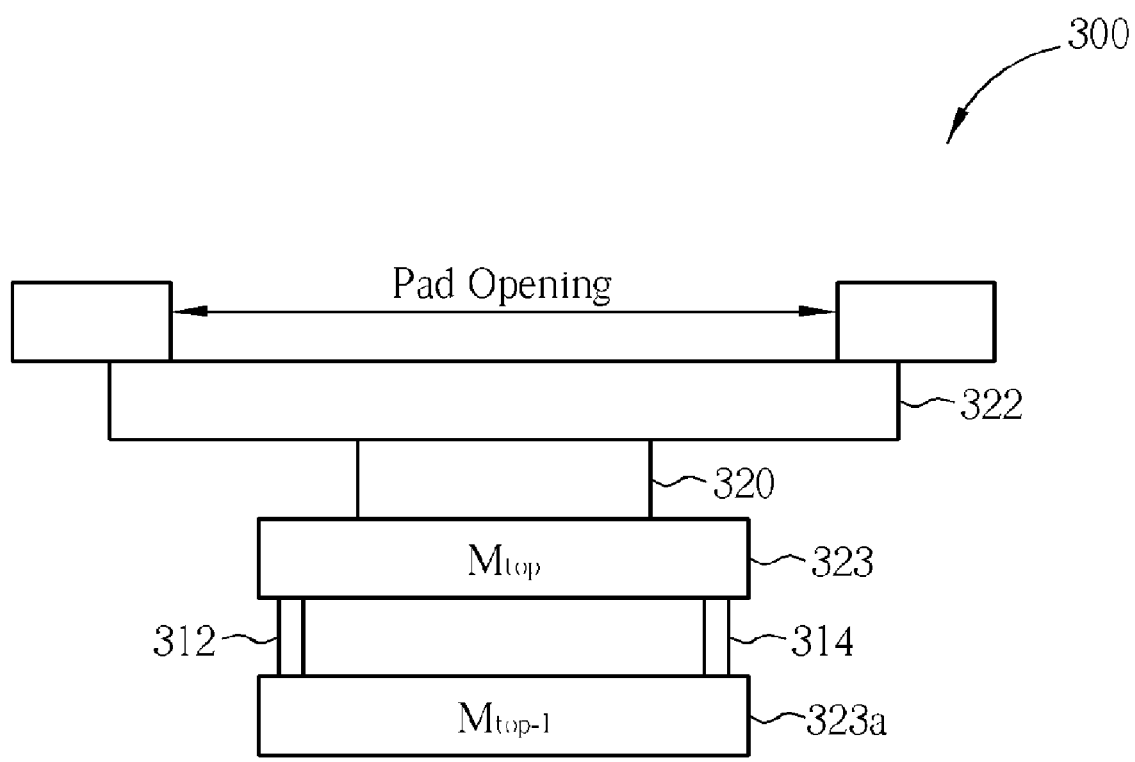
FIG. 3 is a cross-section of a pad according to an exemplary embodiment of the present invention.

Please refer to FIG. 3, which shows a cross-section of a pad structure 300 according to an exemplary embodiment of the present invention. The pad 322 is positioned in a pad opening. The pad 322 is coupled to metal layers 323, 323a of the conductive line through the pad via 320. FIG. 3 only shows the top metal $M_{top}$ 323 and the second top metal $M_{top-1}$ 323a. Please note that the pad structure 300 may comprise more layers than shown. The metal layers $M_{top}$ and $M_{top-1}$ are coupled to each other by means of vias 312 and 314, which ensures that a potential of one layer is equal to a potential of the other. Furthermore, please note that either the top metal $M_{top}$ 323 or the layer $M_{top-1}$ 323a may carry the current, i.e. either metal layer can form the conductive line. The other metal layer may act as a supporting layer for reducing stress of the structure 300. Furthermore, the other metal layer may be in the shape of a hollow ring etc. or any support structure.

Figure 1:
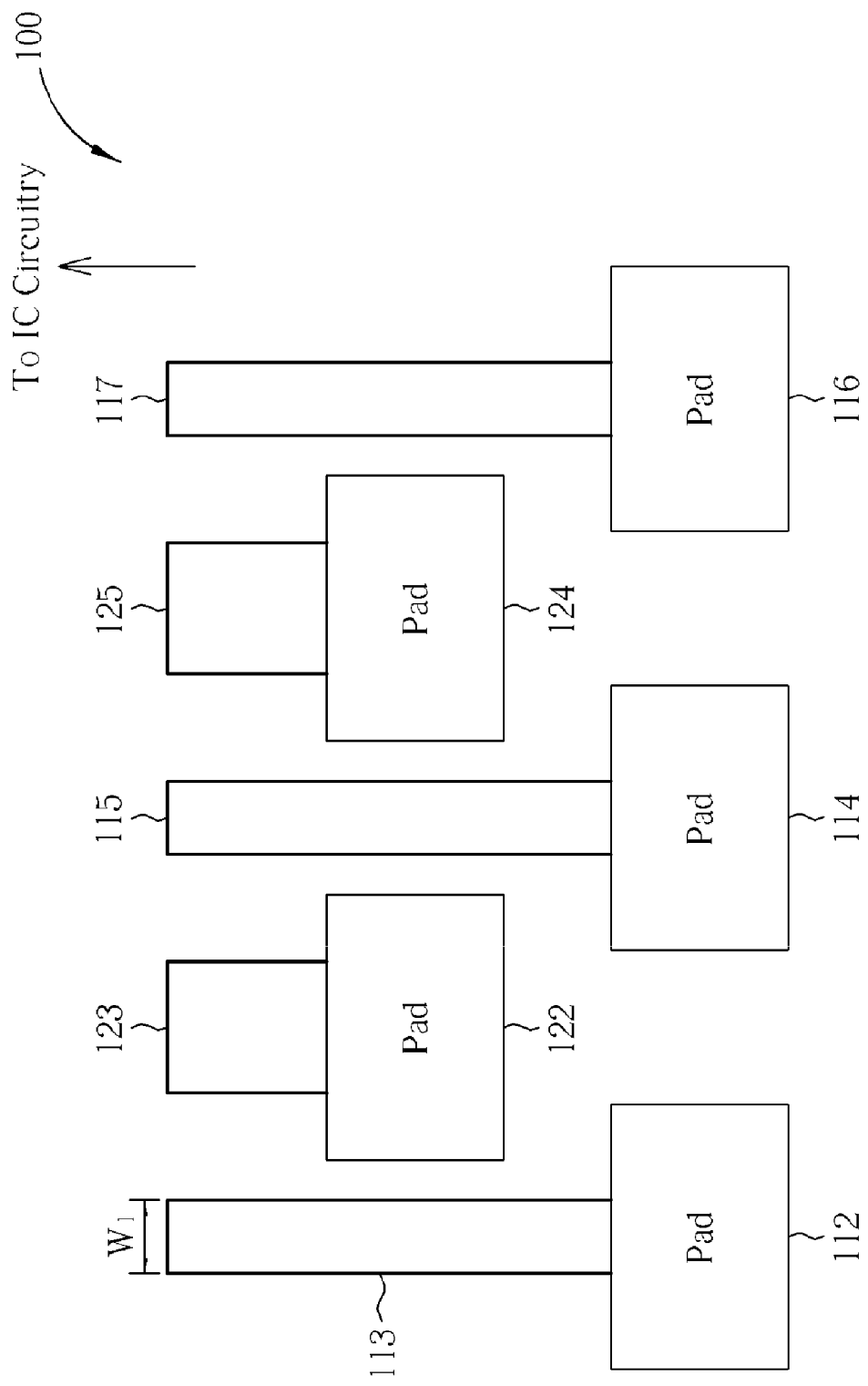
FIG. 1 is a diagram of a conventional complex IC.
Figure 2:
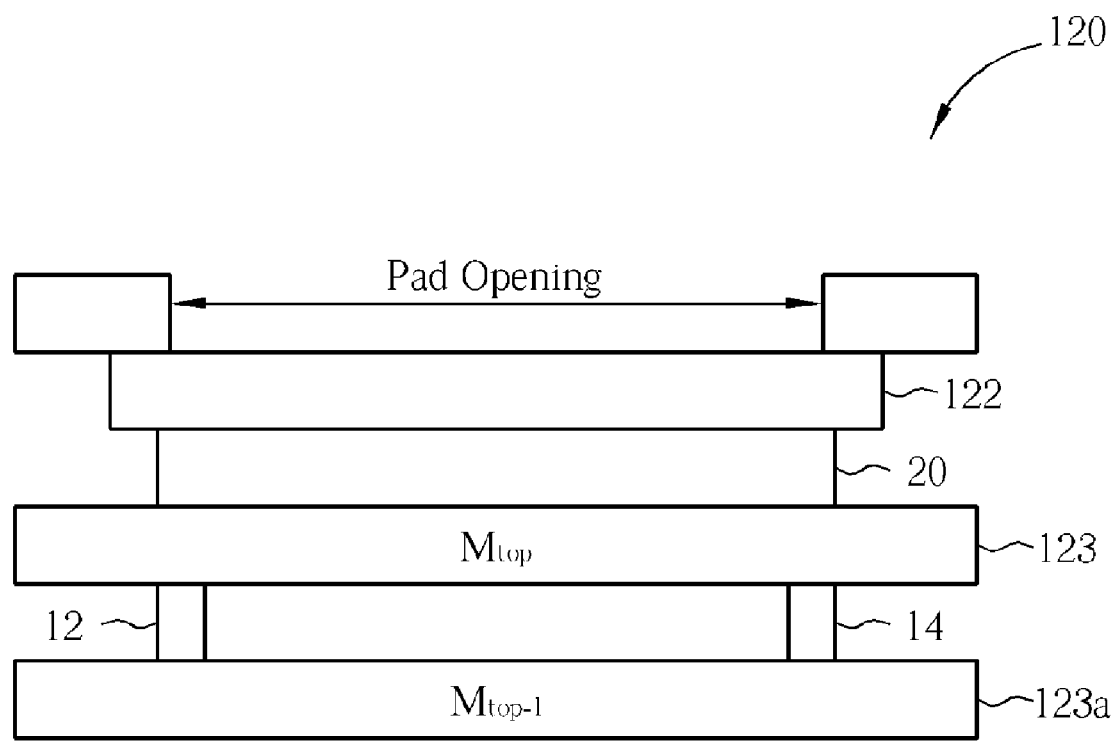
FIG. 2 is a cross-section of a conventional pad shown in FIG. 1.

As can be seen from FIG. 3, the width of the pad via 320, the top metal $M_{top}$ 323 and the second metal layer $M_{top-1}$ 323a are substantially reduced as compared to the conventional pad structure 120 shown in FIG. 2. The pad via 320 in this diagram is shown as being the same width as the top metal 323, but it can also be smaller than the top metal 323. The width of the top metal $M_{top}$ 323 and that of the second metal layer $M_{top-1}$ 323a are not limited to be the same. Although the width of the top metal layer 323 is reduced here, this will not affect the conductive line greatly, as the top metal layer 323 is thicker than other metal layers and can therefore sustain a higher current than other layers.

This structure will therefore be utilized for the inner pads of the complex IC. The shorter distance between the inner pads and the circuitry of the IC, and the fact that the top metal layer can still sustain a sufficiently high current will not have a large negative effect on the power that can be supplied by the inner pads. Furthermore, this new structure of the inner pads of the complex IC will enable the outer pads to carry more current, as will be explained below.

Figure 4:
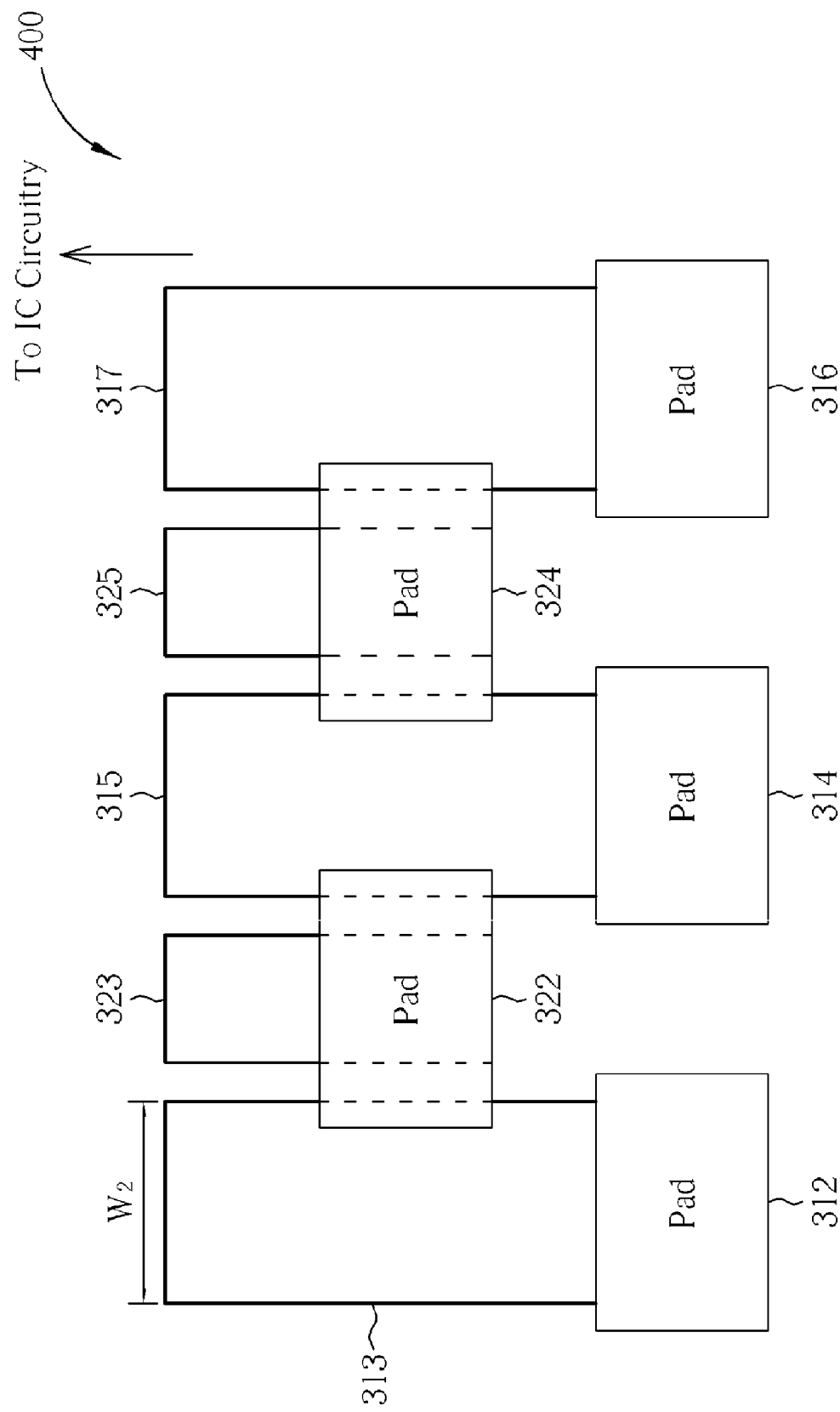
FIG. 4 is a diagram of a complex IC with the pads shown in FIG. 3.

Please refer to FIG. 4. FIG. 4 is a diagram of a complex IC 400 according to an exemplary embodiment of the present invention, wherein the inner pads 322, 324 shown in FIG. 4 have the structure shown in FIG. 3. The complex IC comprises a layer of outer pads 312, 314, 316 respectively coupled to conductive lines 313, 315, 317. The inner pads 322, 324 are respectively coupled to conductive lines 323, 325.

As the width of the pad vias (not shown) of the inner pads have been reduced as well as the metal layers of the conductive lines 323, 325, the width of the conductive lines 313, 315, 317 of the outer pads 312, 314, 316 can be extended to beyond the edge of the adjacent inner pads 322, 324. The restriction of the width $W_2$ of the conductive line 313 shown in FIG. 4 is that a pad via can only contact with a metal layer of a single pad otherwise it will short. Therefore, as long as the pad via of the pad 322 has a smaller (or the same) width as the conductive line 323, the conductive line 313 can be extended to almost touch the conductive line 323. Note that the above-mentioned pad structure can be applied to any multi-tier structure, such as a third-tier or a quad-tier structure. As a person having ordinary skill in the art can readily appreciate the modifications after reading above disclosure, detailed description is omitted here for brevity.

As the conductive lines of outer pads can have an increased width, the problem of electro-migration (caused by current paths being too narrow) will not occur. The reduction in the width of pad vias and metal layers of inner pads allows the inner pads to overlap the conductive lines of outer pads, thereby reducing the pad pitch. The current flow of the conductive lines of the inner pads will not be adversely affected by the reduction in width, as the inner pads are closer to the IC circuitry, and the top metal layer is thicker than other metal layers, and can therefore sustain a higher current.

The pad structure of the present invention therefore provides a complex IC bond pad array that has the advantages of smaller pad pitch without increasing the electro-migration.

Those skilled in the art will readily observe that numerous modifications and alterations of the device and method may be made while retaining the teachings of the invention.

What is claimed is:

1. An integrated circuit comprising:
   a substrate; and
   a bond pad array on the substrate, the bond pad array comprising:
      a row of inner bond pads, each inner bond pad positioned with respect to a plurality of inner bond pad openings;
      a plurality of first inner metal layers respectively coupled to the inner bond pads for transmitting signals between the inner bond pads and an internal circuit, wherein at least one first inner metal layer has a width less than a width of a corresponding inner bond pad;
      a row of outer bond pads, each outer bond pad positioned with respect to a plurality of outer bond pad openings, and staggered with respect to the row of inner bond pads; and
      a plurality of first outer metal layers respectively coupled to the outer bond pads for transmitting signals between the outer bond pads and the internal circuit, wherein at least one inner bond pad overlaps adjacent first outer metal layers.

2. The integrated circuit of claim 1, further comprising:
   a plurality of second inner metal layers respectively coupled to the plurality of first inner metal layers, where at least one second inner metal layer has a width less than a width of a corresponding inner bond pad; and
   a plurality of second outer metal layers respectively coupled to the plurality of first outer metal layers.

3. The integrated circuit of claim 2, wherein the second inner metal layers and the second outer metal layers have a hollow structure for supporting the first inner metal layers and the first outer metal layers respectively.

4. The integrated circuit of claim 1, wherein the bond pad array further comprises a plurality of vias respectively coupled between the plurality of first inner metal layers and the row of inner bond pads, a width of each via is the same or smaller than a width of each corresponding first inner metal layer, and a width of each first outer metal layer is less than a distance between two adjacent vias.

5. An integrated circuit comprising:
   a plurality of inner bond pads, positioned with respect to a plurality of inner bond pad openings;
   a plurality of first inner metal layers respectively coupled to the inner bond pads for electrically connecting the inner bond pads to an internal circuit, wherein at least one first inner metal layer has a width less than a width of a corresponding inner bond pad;
   a plurality of outer bond pads, positioned with respect to a plurality of outer bond pad openings; and
   a plurality of first outer metal layers respectively coupled to the outer bond pads for electrically connecting the outer bond pads to the internal circuit, wherein at least one inner bond pad overlaps adjacent first outer metal layer.

6. The integrated circuit of claim 5, further comprising:
   a plurality of second inner metal layers respectively coupled to the plurality of first inner metal layers, where at least one second inner metal layer has a width less than a width of a corresponding inner bond pad.

7. The integrated circuit of claim 5, further comprising:
   a plurality of second inner metal layers respectively coupled to the plurality of first inner metal layers, where at least one second inner metal layer has a width less than a width of a corresponding first inner metal layer.

8. The integrated circuit of claim 5, further comprising:
   a plurality of vias respectively coupled between the plurality of first inner metal layers and the plurality of inner bond pads, where a width of each via is the same as or smaller than a width of each corresponding first inner metal layer, and a width of each first outer metal layer is less than a distance between two adjacent vias.

9. An integrated circuit comprising:
   a substrate; and
   a bond pad array on the substrate, the bond pad array comprising:
      a plurality of bond pads, positioned with respect to a plurality of bond pad openings;
      a plurality of first metal layers respectively coupled to the bond pads for electrically connecting the bond pads to an internal circuit; and
      a plurality of second metal layers respectively coupled to the first metal layers, wherein at least one second metal layer has a width different from a width of a corresponding first metal layer.

10. The integrated circuit of claim 9, wherein at least one first metal layer is thicker than a corresponding second metal layer.

11. The integrated circuit of claim 9, further comprising a plurality of vias respectively coupled between the plurality of first metal layers and the plurality of bond pads, and a width of each via is the same or smaller than a width of each corresponding first metal layer.

* * * * *